(12) United States Patent
Hwang (10) Patent No.: US 9,286,996 B2
(45) Date of Patent: Mar. 15, 2016

(54) NON-VOLATILE MEMORY SYSTEM AND METHOD OF PROGRAMMING THE SAME

(71) Applicant: The-AiO Inc., Seongnam-si, Gyeonggi-do (KR)

(72) Inventor: Sun-Mo Hwang, Suwon-si (KR)

(73) Assignee: The AiO Inc., Gyeonggi-do (KR)

( * ) Notice: Subject to any disclaimer, the term of this patent is extended or adjusted under 35 U.S.C. 154(b) by 0 days.

(21) Appl. No.: 14/362,272

(22) PCT Filed: Dec. 6, 2012

(86) PCT No.: PCT/KR2012/010542
§ 371 (c)(1),
(2) Date: Jun. 2, 2014

(87) PCT Pub. No.: WO2013/085305
PCT Pub. Date: Jun. 13, 2013

(65) Prior Publication Data
US 2014/0362648 A1    Dec. 11, 2014

(30) Foreign Application Priority Data

Dec. 6, 2011 (KR) .................. 10-2011-0129661

(51) Int. Cl.
| | |
|---|---|
| *G11C 16/10* | (2006.01) |
| *G11C 16/34* | (2006.01) |
| *G06F 3/06* | (2006.01) |
| *G06F 12/02* | (2006.01) |

(Continued)

(52) U.S. Cl.
CPC .......... *G11C 16/3486* (2013.01); *G06F 3/0613* (2013.01); *G06F 11/1441* (2013.01); *G06F 12/0246* (2013.01); *G11C 14/00* (2013.01); *G11C 16/10* (2013.01); *G11C 16/22* (2013.01)

(58) Field of Classification Search
USPC ....................................................... 365/185.18
See application file for complete search history.

(56) References Cited

U.S. PATENT DOCUMENTS

| | | | |
|---|---|---|---|
| 7,127,549 | B2 | 10/2006 | Sinclair |
| 7,310,699 | B2 | 12/2007 | Sinclair |

(Continued)

FOREIGN PATENT DOCUMENTS

| | | |
|---|---|---|
| JP | 2006-243780 A | 9/2006 |
| JP | 2007-334863 A | 12/2007 |

(Continued)

OTHER PUBLICATIONS

Japan Patent Office International Search Report issued Jan. 16, 2013.

*Primary Examiner* — Hoai V Ho
*Assistant Examiner* — Jay Radke
(74) *Attorney, Agent, or Firm* — Harness, Dickey & Pierce, P.L.C.

(57) ABSTRACT

A non-volatile memory system includes a first non-volatile memory device, a second non-volatile memory device that performs a write operation more slowly than the first non-volatile memory device, where the first and second non-volatile memory devices are different types of non-volatile memory devices, and a controller that controls the first and second non-volatile memory devices to concurrently perform the write operation for data input from a host based on a write command signal and that outputs a write completion signal to the host when one of the first and second non-volatile memory devices completes the write operation.

7 Claims, 10 Drawing Sheets

(51) Int. Cl.
*G06F 11/14* (2006.01)
*G11C 14/00* (2006.01)
*G11C 16/22* (2006.01)

(56) References Cited

U.S. PATENT DOCUMENTS

| | | | |
|---|---|---|---|
| 7,724,643 | B2 | 5/2010 | Kakihara |
| 7,873,777 | B2 | 1/2011 | Kang |
| 2005/0172067 | A1 | 8/2005 | Sinclair |
| 2006/0056321 | A1 | 3/2006 | Kakihara |
| 2007/0028040 | A1 | 2/2007 | Sinclair |
| 2007/0065961 | A1* | 3/2007 | Park et al. ............ 438/43 |
| 2007/0288688 | A1 | 12/2007 | Kang |
| 2010/0037001 | A1* | 2/2010 | Langlois et al. ............ 711/103 |
| 2010/0235568 | A1 | 9/2010 | Inamura |
| 2012/0089766 | A1* | 4/2012 | Yu et al. ............ 711/103 |
| 2013/0159604 | A1* | 6/2013 | Yeh ............ 711/103 |

FOREIGN PATENT DOCUMENTS

| | | |
|---|---|---|
| JP | 2010-211734 A | 9/2010 |
| KR | 2006-0051050 A | 5/2006 |
| KR | 2007-0001136 A | 1/2007 |

* cited by examiner

NON-VOLATILE MEMORY SYSTEM AND METHOD OF PROGRAMMING THE SAME

CROSS-REFERENCE TO RELATED APPLICATION(S)

This application claims priority under 35 USC §119 to Korean Patent Applications No. 10-2011-0129661, filed on Dec. 6, 2011 in the Korean Intellectual Property Office (KIPO), the contents of which are incorporated herein in its entirety by reference.

BACKGROUND

1. Technical Field

Example embodiments relate generally to a semiconductor memory system. More particularly, embodiments of the present inventive concept relate to a non-volatile memory system including different types of (i.e., heterogeneous) non-volatile memory devices and a method of programming (or, operating) the non-volatile memory system.

2. Description of the Related Art

Generally, a semiconductor memory device may be classified into two types (i.e., a volatile memory device and a non-volatile memory device) according to whether data can be retained when power is not supplied. A NAND flash memory device is widely used as the non-volatile memory device. Recently, the NAND flash memory device includes a multi-level cell (MLC) that stores data having a plurality of bits. Thus, the NAND flash memory device may be manufactured to have a high degree of integration.

However, since the NAND flash memory device is not capable of performing an overwrite operation, the NAND flash memory device needs to perform an erase-before-write operation in a block unit and to perform a merge operation for distinguishing and merging valid data and invalid data under a predetermined condition. In other words, the NAND flash memory device has a lot of limits to operate.

A semiconductor memory system including at least one NAND flash memory device may be manufactured in small size because the NAND flash memory device has a high degree of integration. On the other hand, the semiconductor memory system may not operate at a high speed due to the above limits of the NAND flash memory device. In addition, the semiconductor memory system may lose data when a sudden power-off occurs while the semiconductor memory system performs a write operation.

SUMMARY

Some example embodiments provide a non-volatile memory system capable of operating at a high speed and capable of preventing data loss when a sudden power-off occurs, where the non-volatile memory system includes different types of (i.e., heterogeneous) non-volatile memory devices.

Some example embodiments provide a method of programming (or, operating) the non-volatile memory system.

According to an aspect of example embodiments, a non-volatile memory system may include a first non-volatile memory device, a second non-volatile memory device that performs a write operation more slowly than the first non-volatile memory device, where the first and second non-volatile memory devices are different types of non-volatile memory devices, and a controller that controls the first and second non-volatile memory devices to concurrently perform the write operation for data input from a host based on a write command signal and that outputs a write completion signal to the host when one of the first and second non-volatile memory devices completes the write operation.

In example embodiments, the second non-volatile memory device may continue to perform the write operation to complete the write operation after the controller has outputted the write completion signal to the host due to the first non-volatile memory device having completed the write operation.

In example embodiments, the second non-volatile memory device may continue to complete the write operation based on the written data in the first non-volatile memory device after a sudden power-off has occurred while the second non-volatile memory device was performing the write operation.

In example embodiments, the first non-volatile memory device may be a non-volatile memory device that performs an overwrite operation.

In example embodiments, the first non-volatile memory device may correspond to a phase-change random access memory (PRAM) device, and the second non-volatile memory device may correspond to a NAND flash memory device.

In example embodiments, the non-volatile memory system may be implemented as an embedded multi media card (eMMC).

In example embodiments, a polling check technique or a round robin signaling technique may be used to check whether the one of the first and second non-volatile memory devices completes the write operation.

According to an aspect of example embodiments, a method of programming a non-volatile memory system may include an operation of receiving data from a host based on a write command signal, an operation of controlling first and second non-volatile memory devices to concurrently perform a write operation for the data, where the second non-volatile memory device performs the write operation more slowly than the first non-volatile memory device, an operation of checking whether one of the first and second non-volatile memory devices completes the write operation, and an operation of outputting a write completion signal to the host when the one of the first and second non-volatile memory devices completes the write operation.

Therefore, a non-volatile memory system according to example embodiments may control different types of (i.e., heterogeneous) non-volatile memory devices to concurrently perform a write operation for data input from a host, and may control one of the heterogeneous non-volatile memory devices to output a write completion signal to the host when the one of the heterogeneous non-volatile memory devices completes a write operation for the data. As a result, the non-volatile memory system may make a user feel that the non-volatile memory system operates at a high speed, and may recover lost data by comparing data written in the heterogeneous non-volatile memory devices when a sudden power-off occurs.

In addition, a method of programming (or, operating) a non-volatile memory system according to example embodiments may control different types of non-volatile memory devices included in the non-volatile memory system to concurrently perform a write operation for data input from a host, and may control one of the heterogeneous non-volatile memory devices to output a write completion signal to the host when the one of the heterogeneous non-volatile memory devices completes a write operation for the data.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular terms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
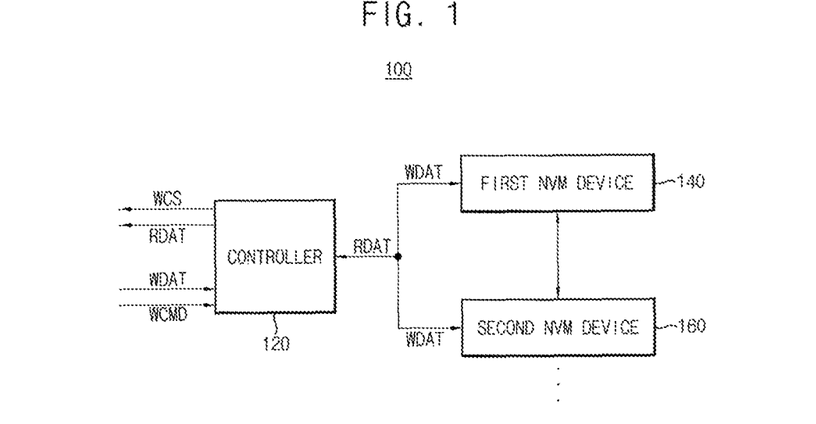
FIG. 1 is a block diagram illustrating a non-volatile memory system according to example embodiments.

FIG. 1 is a block diagram illustrating a non-volatile memory system according to example embodiments.

Referring to FIG. 1, the non-volatile memory system 100 may include a controller 120, a first non-volatile memory device 140, and a second non-volatile memory device 160. Although it is illustrated in FIG. 1 that the non-volatile memory system 100 includes one first non-volatile memory device 140 and one second non-volatile memory device 160, it should be understood that the non-volatile memory system 100 includes at least one first non-volatile memory device 140 and at least one second non-volatile memory device 160. That is, for convenience of description, one first non-volatile memory device 140 and one second non-volatile memory device 160 are illustrated in FIG. 1.

The first non-volatile memory device 140 may be a non-volatile memory device that performs a write operation at a relatively high speed. The second non-volatile memory device 160 may be a non-volatile memory device that performs a write operation at a relatively slow speed. Thus, the second non-volatile memory device 160 may perform a write operation more slowly than the first non-volatile memory device 140. That is, the first non-volatile memory device 140 and the second non-volatile memory device 160 may be different types of (i.e., heterogeneous) non-volatile memory devices. Here, the first non-volatile memory device 140 is a non-volatile memory device for supporting a write operation of the second non-volatile memory device 160. Thus, data WDAT input from a host may be finally stored (or, written) in the second non-volatile memory device 160. As described above, the first non-volatile memory device 140 may perform a write operation faster than the second non-volatile memory device 160. Hence, the first non-volatile memory device 140 may be more expensive than the second non-volatile memory device 160. However, in the non-volatile memory system 100, the first non-volatile memory device 140 may have a relatively small storage capacity compared to the second non-volatile memory device 160. As a result, the non-volatile memory system 100 may be manufactured at low cost because the first non-volatile memory device 140 has a relatively small storage capacity. In addition, the non-volatile memory system 100 may control the first non-volatile memory device 140 to support a write operation of the second non-volatile memory device 160 because the first non-volatile memory device 140 operates at a relatively high speed. In an example embodiment, the first non-volatile memory device 140 may be a non-volatile memory device that can perform an overwrite operation to operate at a relatively high speed. In addition, the second non-volatile memory device 160 may be a non-volatile memory device that can be manufactured in small size while having a relatively large storage capacity. For example, the first non-volatile memory device 140 may correspond to a phase-change random access memory (PRAM) device, and the second non-volatile memory device 160 may correspond to a NAND flash memory device. However, the first and second non-volatile memory devices 140 and 160 are not limited thereto.

The controller 120 may control the first and second non-volatile memory devices 140 and 180 to concurrently perform a write operation for the data WDAT input from the host based on a write command signal WCMD, and may output a write completion signal WCS to the host when one of the first and second non-volatile memory devices 140 and 160 completes a write operation for the data WDAT. As described above, since the first non-volatile memory device 140 is a non-volatile memory device that performs a write operation at a relatively high speed, and the second non-volatile memory device 160 is a non-volatile memory device that performs a write operation at a relatively low speed, the first non-volatile memory device 140 may complete a write operation for the data WDAT earlier than the second non-volatile memory device 160. Under a certain condition (e.g., according to data patterns, etc), the second non-volatile memory device 160 may complete a write operation for the data WDAT earlier than the first non-volatile memory device 140. Therefore, the present inventive concept does not exclude a situation in which the second non-volatile memory device 160 completes a write operation for the data WDAT earlier than the first non-volatile memory device 140. However, a situation in which the first non-volatile memory device 140 completes a write operation for the data WDAT earlier than the second non-volatile memory device 160 is common. When the first non-volatile memory device 140 completes a write operation for the data WDAT earlier than the second non-volatile memory device 160, the second non-volatile memory device 160 may continue to perform a write operation for the data WDAT in order to complete a write operation for the data WDAT after the controller 120 has outputted the write completion signal WCS to the host due to the first non-volatile memory device 140 having completed a write operation for the data WDAT.

On this basis, the non-volatile memory system 100 may make a user feel that the non-volatile memory system 100 operates at a high speed because the controller 120 outputs the write completion signal WCS to the host when the first non-volatile memory device 140 completes a write operation for the data WDAT (i.e., earlier than the second non-volatile memory device 160). The second non-volatile memory device 160 may complete a write operation for the data WDAT while the user prepares a next write operation (e.g., including data processing time, data transfer time, etc). As a result, the non-volatile memory system 100 may perform a write operation at substantially the same speed as a speed of the first non-volatile memory device 140 but not at a speed of the second non-volatile memory device 160. Meanwhile, after the controller 120 has outputted the write completion signal WCS to the host due to the first non-volatile memory device 140 having completed a write operation for the data WDAT, a sudden power-off may occur before the second non-volatile memory device 160 completes a write operation for the data WDAT. In this case, the data WDAT may be lost because the second non-volatile memory device 160 did not complete a write operation for the data WDAT (i.e., the data WDAT are not completely written or stored in the second non-volatile memory device 160). Thus, in the non-volatile memory system 100, when a sudden power-off occurs while the second non-volatile memory device 160 performs a write operation for the data WDAT, the controller 120 may control the second non-volatile memory device 160 to complete a write operation for the data WDAT based on the data WDAT already written in the first non-volatile memory device 140. In addition, the controller 120 may recover the data WDAT by scanning and comparing the first non-volatile memory device 140 and the second non-volatile memory device 160 on a predetermined cycle and/or based on an external command. As a result, the non-volatile memory system 100 may achieve high operating reliability.

As described above, in the non-volatile memory system 100, the first non-volatile memory device 140 generally completes a write operation for the data WDAT earlier than the second non-volatile memory device 160. However, under a certain condition (e.g., according to data patterns, etc), the second non-volatile memory device 160 may complete a write operation for the data WDAT earlier than the first non-volatile memory device 140. Therefore, the controller 120 may check whether one of the first and second non-volatile memory devices 140 and 160 completes a write operation for the data WDAT. Here, a polling check technique or a round robin signaling technique may be used to check whether one of the first and second non-volatile memory devices 140 and 160 completes a write operation for the data WDAT. Since the polling check technique and the round robin signaling technique are well-known to a person in the art (i.e., artisan), the polling check technique and the round robin signaling technique will not be described in detail. While the data WDAT is written (or, stored) in the second non-volatile memory device 160, the non-volatile memory system 100 may read data RDAT (i.e., may perform a read operation for the data RDAT) from the second non-volatile memory device 160 to output the data RDAT to the host based on a read command signal. In brief, the non-volatile memory system 100 may control the heterogeneous non-volatile memory devices 140 and 160 to concurrently perform a write operation for the data WDAT input from the host, and may control one of the heterogeneous non-volatile memory devices 140 and 160 to output the write completion signal WCS to the host when the one of the heterogeneous non-volatile memory devices 140 and 160 completes a write operation for the data WDAT. As a result, the non-volatile memory system 100 may make a user feel that the non-volatile memory system 100 operates at a high speed, and may recover lost data by comparing data written in the heterogeneous non-volatile memory devices 140 and 160 when a sudden power-off occurs. In example embodiments, the non-volatile memory system 100 may be implemented as an embedded multi media card (eMMC). However, the non-volatile memory system 100 is not limited thereto. For example, the non-volatile memory system 100 may be implemented as a secure digital (SD) card, a compact flash (CF) card, a memory stick, an XD picture card, etc.

Figure 2A:
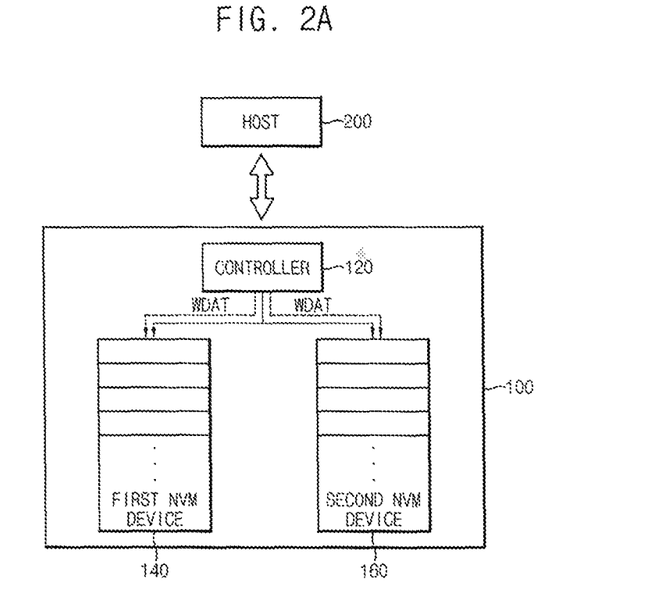
FIGS. 2A through 2C are diagrams illustrating an example embodiment in which a write operation is performed in the non-volatile memory system of FIG. 1.
Figure 2B:
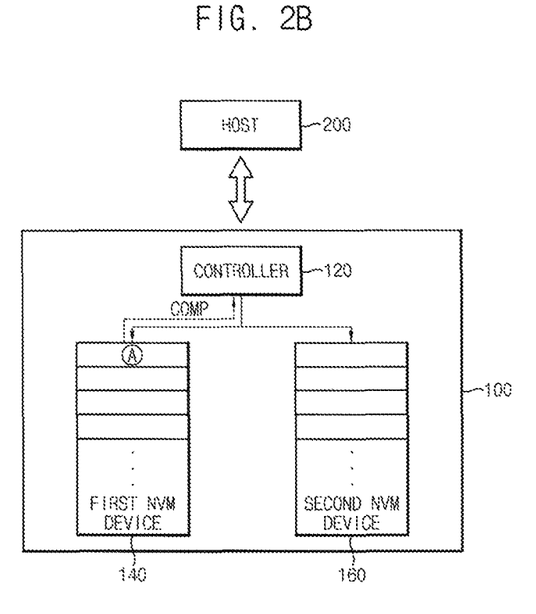
Figure 2C:
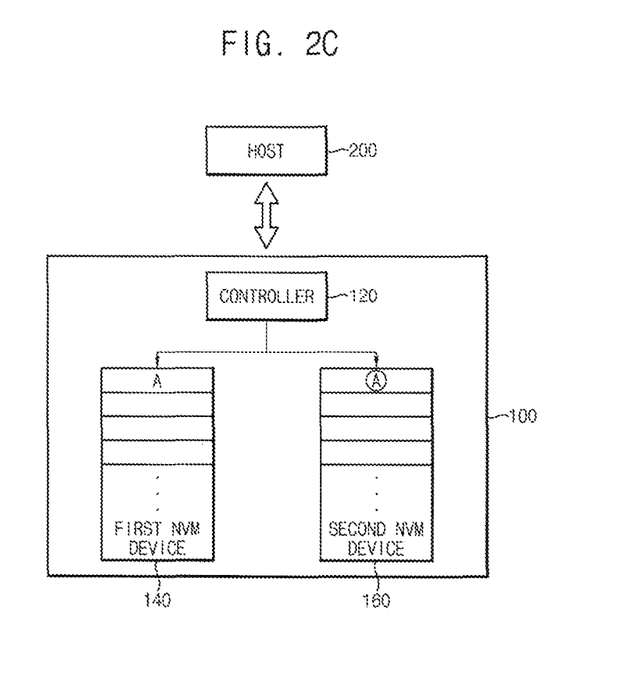

FIGS. 2A through 2C are diagrams illustrating an example embodiment in which a write operation is performed in the non-volatile memory system of FIG. 1.

Referring to FIGS. 2A through 2C, FIG. 2A shows that the controller 120 provides the data WDAT input from the host 200 to the first and second non-volatile memory devices 140 and 160 based on the write command signal WCMD. Thus, the first and second non-volatile memory devices 140 and 160 may concurrently perform a write operation for the data WDAT (e.g., A). FIG. 2B shows that one of the first and second non-volatile memory devices 140 and 160 completes a write operation for the data WDAT (e.g., A). Here, since the first non-volatile memory device 140 performs a write operation at a relatively high speed, and the second non-volatile memory device 160 performs a write operation at a relatively low speed, the first non-volatile memory device 140 may complete a write operation for the data WDAT earlier than the second non-volatile memory device 160. However, under a certain condition (e.g., according to data patterns, etc), the second non-volatile memory device 160 may complete a write operation for the data WDAT earlier than the first non-volatile memory device 140. In FIG. 2B, it is illustrated that the first non-volatile memory device 140 completes a write operation for the data WDAT earlier than the second non-volatile memory device 160, and then provides the controller 120 with a signal COMP indicating that a write operation for the data WDAT is completed. In example embodiments, a polling check technique or a round robin signaling technique may be used to check whether one of the first and second non-volatile memory devices 140 and 160 completes a write operation for the data WDAT. Hence, the signal COMP indicating that a write operation for the data WDAT is completed may be interpreted as various signals for checking whether the first non-volatile memory device 140 and/or the second non-volatile memory device 160 complete a write operation for the data WDAT. FIG. 2C shows that the second non-volatile memory device 160 continues to perform a write operation for the data WDAT to complete a write operation for the data WDAT after the controller 120 outputs the write completion signal WCS to the host 200 as the first non-volatile memory device 140 completes a write operation for the data WDAT. That is, the second non-volatile memory device 160 may not stop performing a write operation for the data WDAT when the controller 120 outputs the write completion signal WCS to the host 200. Thus, the second non-volatile memory device 160 may complete a write operation for the data WDAT while the user prepares a next write operation (e.g., including data processing time, data transfer time, etc). This is because the data WDAT input from the host 200 need to be finally stored (or, written) in the second non-volatile memory device 160. As described above, since the first non-volatile memory device 140 supports a write operation of the second non-volatile memory device 160 in the non-volatile memory system 100, a user may feel that the non-volatile memory system 100 operates at a high speed (i.e., at substantially the same speed as a speed of the first non-volatile memory device 140).

FIGS. 3A through 3D are diagrams illustrating an example embodiment in which a recovery operation is performed in the non-volatile memory system of FIG. 1.

Figure 3A:
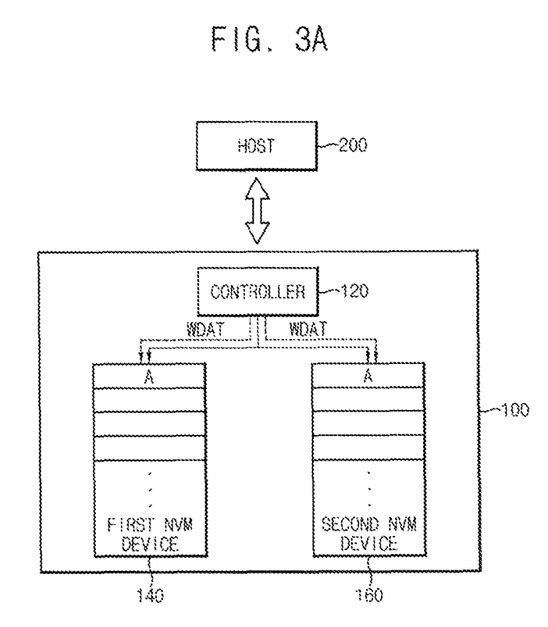
FIGS. 3A through 3D are diagrams illustrating an example embodiment in which a recovery operation is performed in the non-volatile memory system of FIG. 1.
Figure 3B:
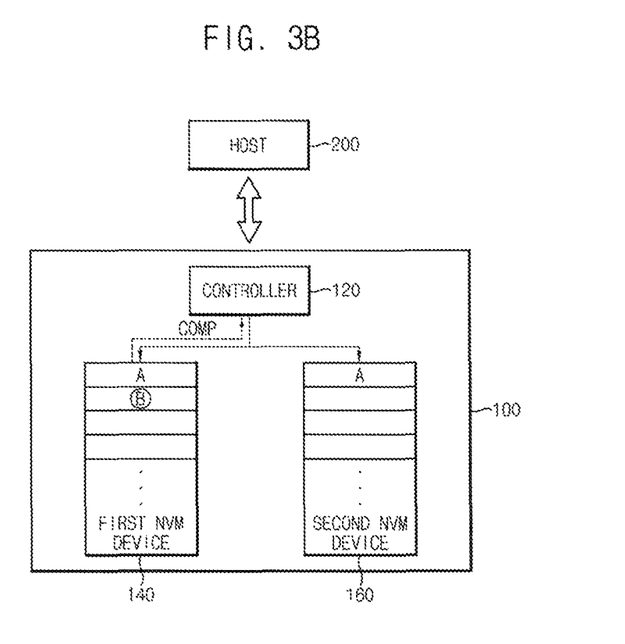
Figure 3C:
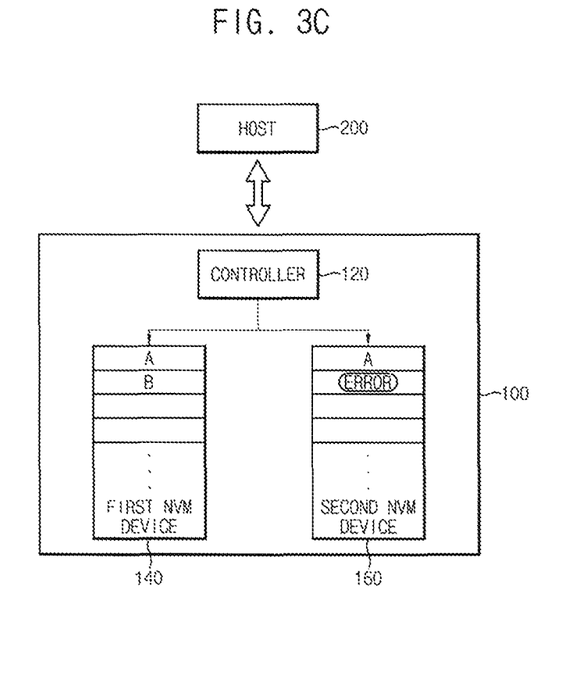
Figure 3D:
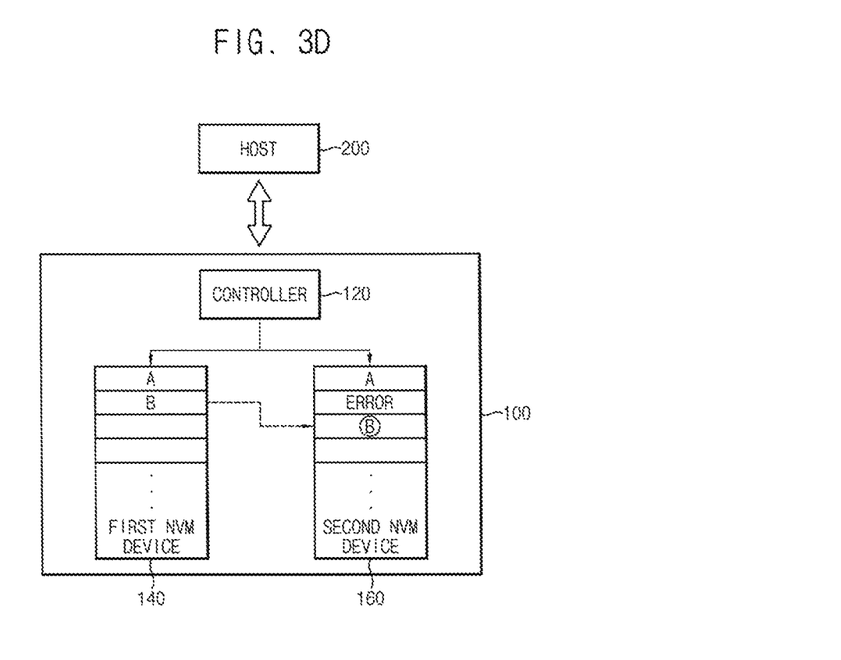

Referring to FIGS. 3A through 3D, FIG. 3A shows that the controller 120 provides the data WDAT input from the host 200 to the first and second non-volatile memory devices 140 and 160 based on the write command signal WCMD. Thus, the first and second non-volatile memory devices 140 and 160 may concurrently perform a write operation for the data WDAT (e.g., B). FIG. 3B shows that one of the first and second non-volatile memory devices 140 and 160 completes a write operation for the data WDAT (e.g., B). In FIG. 3B, it is illustrated that the first non-volatile memory device 140 completes a write operation for the data WDAT earlier than the second non-volatile memory device 160, and then provides the controller 120 with a signal COMP indicating that a write operation for the data WDAT is completed. In example embodiments, a polling check technique or a round robin signaling technique may be used to check whether one of the first and second non-volatile memory devices 140 and 160 completes a write operation for the data WDAT. Hence, the signal COMP indicating that a write operation for the data WDAT is completed may be interpreted as various signals for checking whether the first non-volatile memory device 140 and/or the second non-volatile memory device 160 complete a write operation for the data WDAT. FIG. 3C shows that a sudden power-off occurs while the second non-volatile memory device 160 performs a write operation for the data WDAT. Here, the host 200 may attempt to read the data WDAT from the second non-volatile memory device 160 because the write completion signal WCS is output to the host 200. In this case, an error may occur because the data WDAT is not stored (or, written) in the second non-volatile memory device 160. To prevent the above case, as illustrated in FIG. 3D, the second non-volatile memory device 160 may complete a write operation for the data WDAT based on the data WDAT written in the first non-volatile memory device 140. As described above, the non-volatile memory system 100 may achieve high operating reliability by recovering lost data by comparing data written in the heterogeneous non-volatile memory devices 140 and 160 when a sudden power-off occurs.

Figure 4:
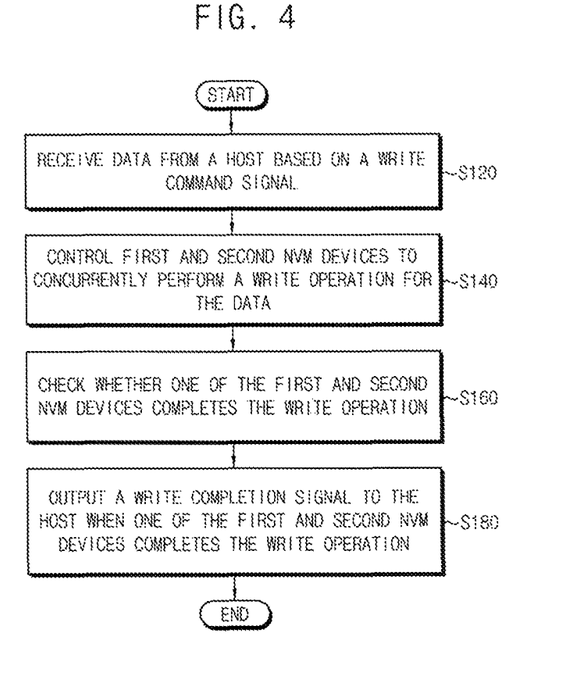
FIG. 4 is a flowchart illustrating a method of programming a non-volatile memory system according to example embodiments.
Figure 5:
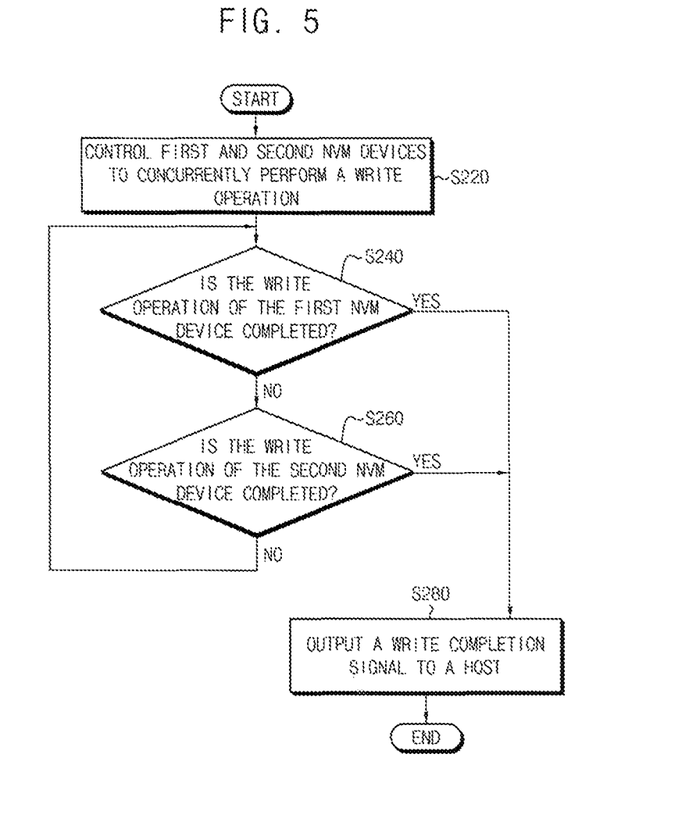
FIG. 5 is a flowchart illustrating an example embodiment in which the method of FIG. 4 checks whether one of first and second non-volatile memory devices completes a write operation.
Figure 6:
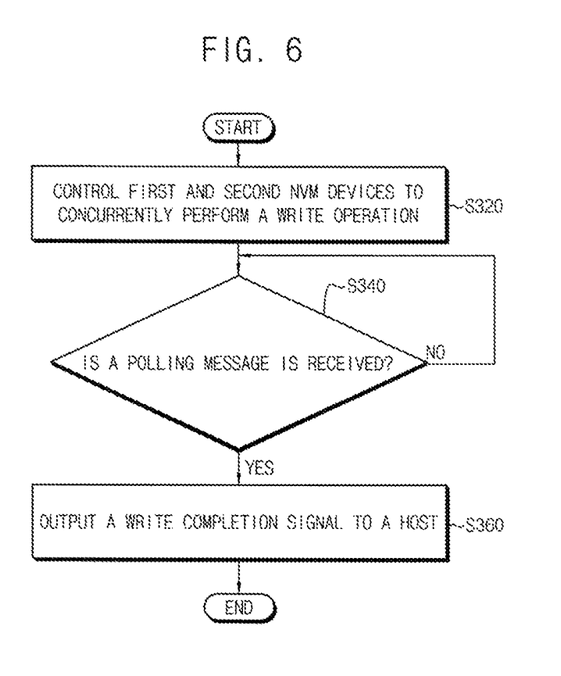
FIG. 6 is a flowchart illustrating another example embodiment in which the method of FIG. 4 checks whether one of first and second non-volatile memory devices completes a write operation.

FIG. 4 is a flowchart illustrating a method of programming a non-volatile memory system according to example embodiments. FIG. 5 is a flowchart illustrating an example embodiment in which the method of FIG. 4 checks whether one of first and second non-volatile memory devices completes a write operation. FIG. 6 is a flowchart illustrating another example embodiment in which the method of FIG. 4 checks whether one of first and second non-volatile memory devices completes a write operation.

Referring to FIG. 4, the method of FIG. 4 may receive data from a host based on a write command signal (Step S120), may control first and second non-volatile memory devices to concurrently perform a write operation for the data (Step S140), where the second non-volatile memory device performs a write operation for the data more slowly than the first non-volatile memory device, may check whether one of the first and second non-volatile memory devices completes a write operation for the data (Step S160), and may output a write completion signal to the host (Step S180) when one of the first and second non-volatile memory devices completes a write operation for the data. In example embodiments, the method of FIG. 4 may use various techniques to check whether the first non-volatile memory device and/or the second non-volatile memory device complete a write operation for the data. For example, a polling check technique or a round robin signaling technique may be used to check whether the first non-volatile memory device and/or the second non-volatile memory device complete a write operation for the data.

In an example embodiment, as illustrated in FIG. 5, a round robin signaling technique may be used to check whether the first non-volatile memory device and/or the second non-volatile memory device complete a write operation for the data. That is, after the method of FIG. 4 controls the first and second non-volatile memory devices to concurrently perform a write operation for the data (Step S220), the method of FIG. 4 may check whether a write operation for the data of the first non-volatile memory device is completed (Step S240). Here, when a write operation for the data of the first non-volatile memory device is completed, the method of FIG. 4 may output a write completion signal to the host (Step S280). On the other hand, when a write operation for the data of the first non-volatile memory device is not completed, the method of FIG. 4 may check whether a write operation for the data of the second non-volatile memory device is completed (Step S260). Similarly, when a write operation for the data of the second non-volatile memory device is completed, the method of FIG. 4 may output the write completion signal to the host (Step S280). On the other hand, when a write operation for the data of the second non-volatile memory device is not completed, the method of FIG. 4 may check whether a write operation for the data of the first non-volatile memory device is completed (Step S240). As described above, the method of FIG. 4 may repeat the Steps S240 and S260 (i.e., the round robin signaling technique) until one of the first and second non-volatile memory devices complete a write operation for the data. As a result, the method of FIG. 4 may efficiently check whether the first non-volatile memory device and/or the second non-volatile memory device complete a write operation for the data.

In another example embodiment, as illustrated in FIG. 6, a polling check technique may be used to check whether the first non-volatile memory device and/or the second non-volatile memory device complete a write operation for the data. That is, after the method of FIG. 4 controls the first and second non-volatile memory devices to concurrently perform a write operation for the data (Step S320), the method of FIG. 4 may check whether a polling message is received from one of the first and second non-volatile memory devices (Step S340). Here, when the polling message is received from one of the first and second non-volatile memory devices, the method of FIG. 4 may output a write completion signal to the host (Step S360). On the other hand, when the polling message is not received from the first and second non-volatile memory devices, the method of FIG. 4 may repeat the Step S340 until the polling message is received from one of the first and second non-volatile memory devices. As described above, the method of FIG. 4 may repeat the Step S340 (i.e., the polling check technique) until one of the first and second non-volatile memory devices outputs the polling check message. As a result, the method of FIG. 4 may efficiently check whether the first non-volatile memory device and/or the second non-volatile memory device complete a write operation for the data.

Although a few example embodiments (e.g., a non-volatile memory system and a method of programming (or, operating) a non-volatile memory system) have been described, those skilled in the art will readily appreciate that many modifications are possible in the example embodiments without materially departing from the novel teachings and advantages of the present inventive concept. For example, it should be understood that a polling check technique and a round robin signaling technique illustrated in FIGS. 5 and 6 are simplified for convenience of description. Therefore, the polling check technique and the round robin signaling technique illustrated in FIGS. 5 and 6 may be modified in various ways without materially departing from the novel teachings and advantages of the present inventive concept.

The present inventive concept may be applied to a non-volatile memory system that includes different types of (i.e., heterogeneous) non-volatile memory devices. Thus, the present inventive concept may be applied to a multi media card (MMC), an embedded multi media card (eMMC), a secure digital (SD) card, a compact flash (CF) card, a memory stick, an XD picture card, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory system comprising:
a first non-volatile memory device;
a second non-volatile memory device configured to perform a write operation slower than the first non-volatile memory device performs the write operation, the first non-volatile memory device and the second non-volatile memory device being different types of non-volatile memory devices; and
a controller configured to,
control the first non-volatile memory device to perform, based on a write command signal, the write operation such that the first non-volatile memory device performs the write operation to write data input from a host concurrently with the second non-volatile memory device performing the write operation to write the data to the second non-volatile memory device,
output a write completion signal to the host when the first non-volatile memory device has completed the write operation, and
control the second non-volatile memory device to perform, based on the write command signal, the write operation to write the data to the second non-volatile memory device concurrently with the first non-volatile memory performing the write operation on the data such that, after the controller outputs the write completion signal associated with the first non-volatile memory device completing the write operation, the second non-volatile memory device continues to perform the write operation to complete writing the data thereto.

2. The system of claim 1, wherein the second non-volatile memory device completes the write operation based on the data written in the first non-volatile memory device when a sudden power-off occurs while the second non-volatile memory device performs the write operation.

3. The system of claim 1, wherein the first non-volatile memory device is a non-volatile memory device that performs an overwrite operation.

4. The system of claim 3, wherein the first non-volatile memory device is a phase-change random access memory (PRAM) device, and the second non-volatile memory device is a NAND flash memory device.

5. The system of claim 4, wherein the non-volatile memory system is implemented as an embedded multi media card (eMMC).

6. The system of claim 1, wherein a polling check technique or a round robin signaling technique is used to check whether one of the first non-volatile memory device and the second non-volatile memory device has completed the write operation.

7. A method of programming a non-volatile memory system comprising:
receiving data from a host based on a write command signal;
first controlling a first non-volatile memory device to perform, based on the write command signal, a write operation on the data received from the host such that the first non-volatile memory device performs the write operation concurrently with a second non-volatile memory device performing the write operation to write the data to the second non-volatile memory device, the second non-volatile memory device performing the write operation slower than the first non-volatile memory device performs the write operation;

second controlling the second non-volatile memory device to perform, based on the write command signal, the write operation to write the data to the second non-volatile memory device concurrently with the first non-volatile memory device performing the write operation such that, after a write completion signal associated with the first non-volatile memory device completing the write operation is output, the second non-volatile memory device continues to perform the write operation to complete writing the data thereto;

checking whether the first non-volatile memory device has completed the write operation; and outputting the write completion signal to the host when the first non-volatile memory devices has completed the write operation.

* * * * *